United States Patent [19]

Doi et al.

[11] Patent Number: 5,401,605
[45] Date of Patent: Mar. 28, 1995

[54] POSITIVE WORKING PHOTOSENSITIVE RESIN COMPOSITION CONTAINING 1,2-NAPHTHOQUINONE DIAZIDE ESTERIFICATION PRODUCT OF TRIPHENYLMETHANE COMPOUND

[75] Inventors: Kousuke Doi; Hiroshi Hosoda, both of Kanagawa; Kouichi Takahashi, Sagamihara; Nobuo Tokutake, Kanagawa; Hidekatsu Kohara; Toshimasa Nakayama, both of Chigasaki, all of Japan

[73] Assignee: Tokyo Ohka Kogyo Co., Ltd., Kanagawa, Japan

[21] Appl. No.: 282,772

[22] Filed: Jul. 29, 1994

Related U.S. Application Data

[63] Continuation of Ser. No. 103,965, Aug. 9, 1993, abandoned.

Foreign Application Priority Data

Aug. 12, 1992 [JP] Japan ................... 4-235149

[51] Int. Cl.$^6$ ............................................. G03F 7/023
[52] U.S. Cl. ...................... 430/192; 430/165; 430/193; 534/557
[58] Field of Search ............ 430/165, 192, 193; 534/557

[56] References Cited

U.S. PATENT DOCUMENTS

| | | |
|---|---|---|
| 3,046,118 | 7/1962 | Schmidt . |
| 3,106,465 | 10/1963 | Neugebauer et al. . |
| 3,148,983 | 9/1964 | Fritz et al. . |
| 3,188,210 | 6/1965 | Fritz et al. ................. 430/193 |
| 5,153,096 | 10/1992 | Uenishi et al. ................. 430/192 |
| 5,215,856 | 6/1993 | Jayaraman ................. 430/193 |
| 5,238,775 | 8/1993 | Kajita et al. ................. 430/193 |

FOREIGN PATENT DOCUMENTS

| | | |
|---|---|---|
| 430477A | 6/1991 | European Pat. Off. . |
| 429242 | 1/1992 | Japan . |

OTHER PUBLICATIONS

Print out of Registry No. 48230-10-0 Phenol Compound Having Molecular Formula $C_{31}H_{36}O_3$.
Japanese Patent Publication 37-18015.
Japanese Patent Publication 62-28457.

*Primary Examiner*—Charles L. Bowers, Jr.
*Assistant Examiner*—Christopher G. Young
*Attorney, Agent, or Firm*—Henry T. Burke

[57] ABSTRACT

Proposed is a positive-working photosensitive resin composition suitable as a photoresist in the photolithographic patterning work for the manufacture of, for example, semiconductor devices having excellent storage stability and capable of giving a patterned resist layer having excellent contrast of the images, orthogonality of the cross sectional profile of line patterns and heat resistance along with a satisfactorily high photosensitivity and large focusing latitude. The composition comprises, in admixture with an alkali-soluble novolac resin as a film-forming agent, a photosensitizing agent which is an esterification product of a specific tris(hydroxyphenyl) methane compound of which two of the hydroxyphenyl groups each have a cyclohexyl group bonded thereto at a specified position with at least one naphthoquinone-1,2-diazide sulfonyl group as the esterifying group.

14 Claims, No Drawings

POSITIVE WORKING PHOTOSENSITIVE RESIN COMPOSITION CONTAINING 1,2-NAPHTHOQUINONE DIAZIDE ESTERIFICATION PRODUCT OF TRIPHENYLMETHANE COMPOUND

This application is a continuation application of Ser. No. 08/103,965, filing date: Aug. 9, 1993, now abandoned.

BACKGROUND OF THE INVENTION

The present invention relates to a novel positive-working photosensitive resin composition or, more particularly, to a positive-working photosensitive resin composition of high sensitivity capable of giving a patterned photoresist layer which is excellent in the contrast of the images, focusing latitude and orthogonality of the cross sectional profile of the line pattern as well as in the heat resistance so as to be useful as a photoresist composition for the ultra-fine patterning works on a substrate in the manufacture of various kinds of semiconductor devices such as ICs, LSIs and the like.

As is well known, the process of photolithographic patterning is widely practiced in the manufacturing process of semiconductor devices such as ICs, LSIs and the like. In the photolithographic patterning work, a layer of a photoresist composition is formed on the surface of a substrate such as a semiconductor silicon wafer and the photoresist layer is exposed pattern-wise to actinic rays such as ultraviolet light through a transparency mask bearing the desired pattern for the semiconductor device to form a latent image of the pattern which is then developed by using a developer solution to give a patterned resist layer to serve as a protecting mask for the substrate surface in the subsequent treatment of etching and the like. Photoresist compositions are classified into negative-working ones and positive-working ones depending on the behavior of the photosensitive resin composition against irradiation with actinic rays. Positive-working photoresist compositions of the most widely used type are those comprising an alkali-soluble novolac resin as the film-forming constituent and a photosensitizing agent which is a quinone diazide group-containing compound or, in particular, an aromatic polyhydroxy compound esterified with naphthoquinone-1,2-diazide sulfonic acid.

The above mentioned aromatic polyhydroxy compound is usually selected from those having a plural number of hydroxy groups per molecule such as gallic acid esters and polyhydroxy benzophenones. Various kinds of naphthoquinone 1,2-diazide sulfonic acid esters have been heretofore proposed for the purpose including those disclosed in U. S. Pat. Nos. 3,046,118, 3,106,465 and 3,148,983 and Japanese Patent Publications No. 37-18015 and No. 62-28457.

The positive-working photoresist compositions of the prior art comprising a naphthoquinone 1,2-diazide sulfonic acid ester of a polyhydroxy benzophenone compound, however, are not always quite satisfactory in their performance relative to the sensitivity, contrast of the images, cross sectional profile of line patterns and heat resistance in order to comply with the requirements in the modern manufacturing processes of semiconductor devices involving an extremely fine photolithographic patterning work. Japanese Patent Kokai No. 1-189644 proposes an improved positive-working photoresist composition suitable for ultra-fine patterning works, in which the photosensitizing agent is a naphthoquinone 1,2-diazide sulfonic acid ester of a specific tris(hydroxyphenyl) methane compound instead of the conventional polyhydroxy benzophenone compound. This positive-working photoresist composition, however, is still not quite satisfactory in respect of the heat resistance of the patterned resist layer and in respect of the storage stability of the coating solution of the composition sometimes to cause precipitation of the photosensitizing agent. Furthermore, it is a requirement for the positive-working photosensitive resin composition in recent years that the layer of the photosensitive resin composition should have a so-called focusing latitude as large as possible in order to comply with varied depth of focus in the exposure of the layer to light depending on the difference in the thickness of the photosensitive layer.

SUMMARY OF THE INVENTION

The present invention accordingly has an object to provide a novel and improved positive-working photosensitive resin composition useful as a photoresist material capable of being in compliance with the requirements in the modern photolithographic patterning technology in the manufacture of semiconductor devices to be freed from the above described problems and disadvantages in the conventional positive-working photoresist compositions. This object can be achieved by compounding an alkali-soluble novolac resin with a very specific photosensitizing agent which has been discovered after the extensive investigations undertaken by the inventors.

Thus, the positive-working photosensitive resin composition of the present invention is a uniform mixture which comprises:

(a) an alkali-soluble novolac resin as a film-forming agent; and (b) a triphenyl methane compound represented by the general formula

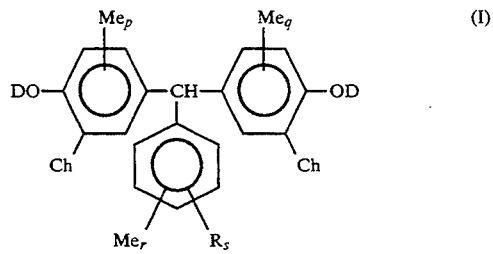

or the general formula

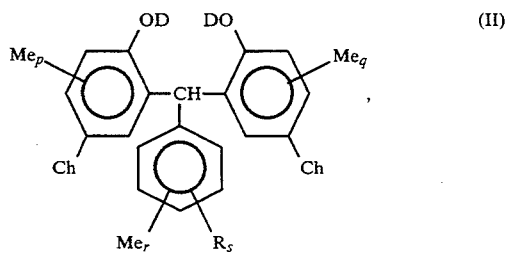

in which at least one of the groups denoted by D is a naphthoquinone 1,2-diazide sulfonyl group, the remainder, if any, being each a hydrogen atom, each R is, independently from the others, a hydrogen atom, a hydroxy group or a group denoted by OD, Me denotes a methyl group, Ch denotes a cyclohexyl group, the subscripts p, q and r are, each independently from the others, 0, 1, 2 or 3 and the subscript s is a positive integer with the proviso that r+s=5, as a photosensitizing agent.

In particular, the photosensitizing agent as the component (b) is preferably a compound represented by the general formula

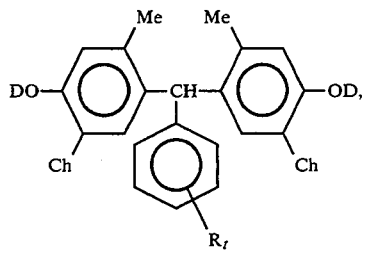

(III)

or by the general formula

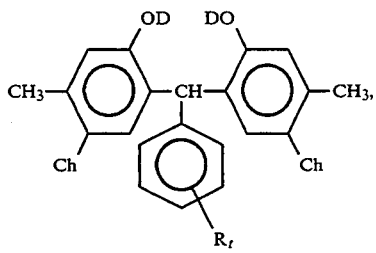

(IV)

in which the subscript t is 0, 1, 2 or 3 and each of the other symbols has the same meaning as defined above.

DETAILED DESCRIPTION OF THE PREFERRED EMBODIMENTS

As is understood from the above given description, the most characteristic feature of the inventive positive-working photosensitive resin composition consists in the formulation of the very specific compound represented by the general formula (I) or (II) as the photosensitizing agent, which is a triphenyl methane derivative in which two of the phenolic phenyl groups each have a cyclohexyl group at the meta-position and at least one of the phenolic phenyl groups is esterified with naphthoquinone 1,2-diazide sulfonyl group at the phenolic OH group. This compound has good solubility in many organic solvents conventionally used in photoresist compositions along with good miscibility with the alkali-soluble novolac resin as the film-forming ingredient in the composition.

The compound of the general formula (I) or (II) can be prepared by the condensation reaction of a tris(hydroxyphenyl) methane compound represented by the general formula

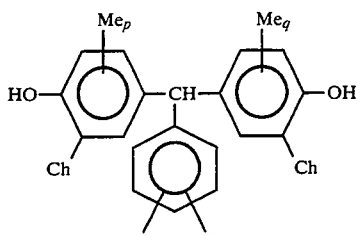

(V)

or

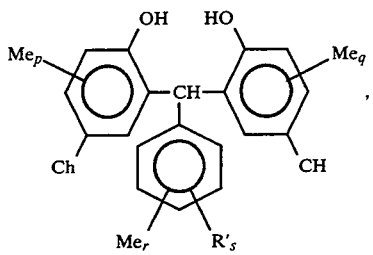

(VI)

in which each of the groups denoted by R' is a hydroxy group or a hydrogen atom and each of the other symbols has the same meaning as defined above, with a naphthoquinone 1,2-diazide sulfonyl halide to effect full or partial esterification reaction. This condensation reaction is performed in an inert solvent such as dioxane and the like in the presence of a basic compound as an acid acceptor such as triethanolamine, alkali carbonates and alkali hydrogen-carbonates.

Examples of the starting tris(hydroxyphenyl) methane compound of the general formula (V) include: bis(3-cyclohexyl-4-hydroxyphenyl)-3-hydroxyphenyl methane; bis-(3-cyclohexyl-4-hydroxyphenyl)-2-hydroxyphenyl methane; bis(3-cyclohexyl-4-hydroxyphenyl)-4-hydroxyphenyl methane; bis(5-cyclohexyl-4-hydroxy-2-methylphenyl)-3-hydroxyphenyl methane; bis(5-cyclohexyl-4-hydroxy-2-methylphenyl)-4-hydroxyphenyl methane; bis(5-cyclohexyl-4-hydroxy-2-methylphenyl)-2-hydroxyphenyl methane; bis(5-cyclohexyl-4-hydroxy-2,3-dimethylphenyl)-3-hydroxyphenyl methane; bis(5-cyclohexyl-4-hydroxy-2,3-dimethylphenyl)-4-hydroxyphenyl methane; bis(5-cyclohexyl-4-hydroxy-2,3-dimethylphenyl)-2-hydroxyphenyl methane; bis(5-cyclohexyl-4-hydroxy-3,6-dimethylphenyl-3-hydroxyphenyl methane; bis(5-cyclohexyl-4-hydroxy-3,6-dimethylphenyl)-4-hydroxyphenyl methane; bis(5-cyclohexyl-4-hydroxy-3,6-dimethylphenyl)-2-hydroxyphenyl methane; bis(5-cyclohexyl-4-hydroxy-2,3,6-trimethylphenyl)-2-hydroxyphenyl methane; bis(3-cyclohexyl-4-hydroxyphenyl)-4-hydroxy-3-methylphenyl methane; bis(3-cyclohexyl-4-hydroxy-2-methylphenyl)-4-hydroxy-3,5-dimethylphenyl methane; bis(5-cyclohexyl-4-hydroxy-2-methylphenyl)-3,4-dihydroxyphenyl methane; and the like. In particular, the tris(hydroxyphenyl) methane compounds represented by the following general formula are preferred as the starting material in respect of the high photosensitivity and large focusing latitude of the photosensitive resin composition prepared by compounding the component (b) prepared therefrom:

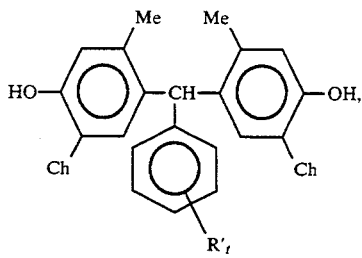

(VII)

in which each of the symbols has the same meaning as defined above. Examples of such a preferable starting compound include: bis(5-cyclohexyl-4-hydroxy-2-methylphenyl)-2-hydroxyphenyl methane; bis(5-cyclohexyl-4-hydroxy-2-methylphenyl)-4-hydroxyphenyl methane; and bis(5-cyclohexyl-4-hydroxy-2-methylphenyl)-3,4-dihydroxyphenyl methane.

The compounds of the general formula (I) belonging to a particularly preferable class include those represented by the general formula

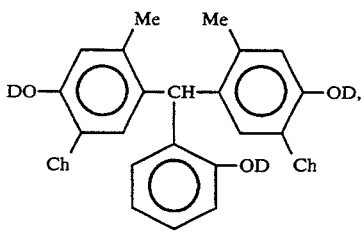

(VIII)

in which at least one of the groups denoted by D is a naphthoquinone 1,2-diazide sulfonyl group, the remainder, if any, being each a hydrogen atom.

Examples of the starting tris(hydroxyphenyl) methane compound of the general formula (VI) include: bis(3-cyclohexyl-6-hydroxyphenyl)-3-hydroxpyhenyl methane; bis(3-cyclohexyl-6-hydroxyphenyl)-4-hydroxyphenyl methane; bis(5-cyclohexyl-2-hydroxy-4-methylphenyl)-2-hydroxyphenyl methane; bis(5-cyclohexyl-2-hydroxy-4-methylphenyl)-4-hydroxyphenyl methane; bis(5-cyclohexyl-2-hydroxy-4,6-dimethylphenyl)-2-hydroxyphenyl methane; bis(5-cyclohexyl-2-hydroxy-4,6-dimethylphenyl)-4-hydroxyphenyl methane; bis(5-cyclohexyl-2-hydroxy-3,4-dimethylphenyl)-2-hydroxyphenyl methane; bis(5-cyclohexyl-2-hydroxy-4-methylphenyl)-2-hydroxy-4-methylphenyl methane; bis(5-cyclohexyl-2-hydroxy-4-methylphenyl)-2-hydroxy-3,4,5-trimethylphenyl methane; bis(5-cyclohexyl-2-hydroxy-3,4-dimethylphenyl)-4-hydroxy-2,3,5-trimethylphenyl methane; bis(5-cyclohexyl-2-hydroxy-4-methylphenyl)-3,4-dihydroxyphenyl methane; and the like. In particular, photosensitizing agents in the invention having an effect of improving the photosensitivity of the composition, focusing latitude of the resist layer and heat resistance of the patterned resist layer can be prepared from the starting compound represented by the general formula

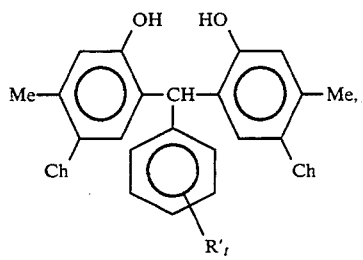

(IX)

in which each of the symbols has the same meaning as defined above. Examples of such a compound include: bis(5-cyclohexyl-2-hydroxy-4-methylphenyl)-2-hydroxyphenyl methane; bis(5-cyclohexyl-2-hydroxy-4-methylphenyl)-4-hydroxyphenyl methane; and bis(5-cyclohexyl-2-hydroxy-4-methylphenyl)-3,4-dihydroxyphenyl methane.

On the other hand, examples of preferable naphthoquinone 2-diazide sulfonyl halide compounds to be reacted with the above described tris(hydroxyphenyl) methane compound include: naphthoquinone 2-diazide-4-sulfonyl chloride and bromide; naphthoquinone 2-diazide-5-sulfonyl chloride and bromide; and the like.

The photosensitizing agent in the inventive photosensitive resin composition is obtained by the esterification of at least one of the phenolic hydroxy groups in the starting tris(hydroxyphenyl) methane compound. The esterification reaction can be either complete to esterify all of the phenolic hydroxy groups or partial to esterify one or more but not all of the phenolic hydroxy groups in the starting compound. Generally speaking, fully esterified products are preferred when good orthogonality of the cross sectional profile is desired of the line pattern of the patterned resist layer and partially esterified compounds are preferred when a high sensitivity is desired of the photosensitive resin composition of the invention. It is of course optional that the photosensitizing agent as the component (b) in the inventive composition is a combination of two kinds or more of different compounds each falling within the definition of the component (b).

It is further optional that the inventive photosensitive resin composition is additionally admixed with other quinone diazide group-containing compounds such as the reaction products of ortho-benzoquinone diazide, orthonaphthoquinone diazide and ortho-anthraquinone diazide as well as sulfonyl chloride thereof with a compound having a hydroxy group or amino group in the molecule such as phenol, p-methoxyphenol, dimethyl phenol, hydroquinone, bisphenol A, naphthol, pyrocatechol, pyrogallol, polyhydroxy benzophenones, pyrogallol monomethyl ether, pyrogallol 3-dimethyl ether, gallic acid, partially esterified or etherified gallic acid leaving unreacted hydroxy groups, aniline, p-amino diphenyl amine and the like.

The film-forming ingredient in the inventive positive-working photosensitive resin composition is an alkali-soluble novolac resin which is not particularly limitative including those conventionally used in the positive-working photoresist compositions. Namely, the alkali-soluble novolac resin can be prepared by the condensation reaction of an aromatic hydroxy compound such as phenol, cresol and xylenol with an aldehyde such as formaldehyde in the presence of an acidic catalyst. It is preferable in respect of the heat resistance of the resin composition that the novolac resin has a weight-average molecular weight in the range from 2000 to 20000 or, more preferably, from 5000 to 15000 after removal of the low molecular-weight species by fractionation.

As to the formulation of the inventive photosensitive resin composition, the weight proportion of the alkali-soluble novolac resin as the component (a) and the photosensitizing agent as the component (b) is, usually, in the range from 1:2 to 20:1 or, preferably, in the range from 1:1 to 6:1. When the amount of the component (b) is too small, a decrease is caused in the fidelity of the reproduced pattern to the pattern on the photomask. When the amount of the component (b) is too large, on the other hand, the resist layer of the composition formed on a substrate surface would be poor in the uniformity along with a decrease in the resolution of fine patterns.

The photosensitive resin composition of the invention is usually prepared in the form of a solution by dissolving the essential and optional ingredients in an organic solvent in order to facilitate the coating works therewith. Examples of suitable organic solvents include: ketones such as acetone, methyl ethyl ketone, cyclohexanone and methyl isoamyl ketone; polyhydric alcohols and derivatives thereof such as ethyleneglycol, ethyleneglycol monoacetate, diethyleneglycol and diethyleneglycol monoacetate as well as monomethyl ethers, monoethyl ethers, monopropyl ethers, monobutyl ethers and monophenyl ethers thereof; cyclic ethers such as dioxane; and esters such as ethyl lactate, methyl acetate, ethyl acetate, butyl acetate, methyl pyruvate, ethyl pyruvate, methyl methoxypropionate and ethyl ethoxypropionate. These organic solvents can be used either singly or as a combination of two kinds or more according to need.

It is optional that the photosensitizing ingredient in the inventive photosensitive resin composition is a combination of the above described essential component (b) and one or more of conventional photosensitizing compounds in a limited amount. Examples of such optional photosensitizing compounds include mercaptoxazole, mercaptobenzoxazole, mercaptoxazoline, mercaptobenzothiazole, benzoxazolinone, benzothiazolone, mercaptobenzimidazole, urazole, thiouracyl, mercaptopyrimidine, imidazolone, tris(4-hydroxyphenyl) ethane, 1,3-bis(4-hydroxyphenyl) propane, 2,3,4-trihydroxybenzophenone and $\alpha$, $\alpha'$, $\alpha''$-tris(4-hydroxyphenyl)-1,3,5-triisopropyl benzene (Trisphenol TC, a tradename of a product by Mitsui Petrochemical Co.) as well as derivatives thereof, These optional photosensitizing compounds can be used either singly or as a combination of two kinds or more. The amount of the optional photosensitizing compounds is limited usually not to exceed 20% by weight based on the amount of the alkali-soluble novolac resin as the component (a). No particular additional advantages can be obtained by increasing the amount of these optional photosensitizing compounds to exceed the above mentioned upper limit.

It is of course optional that the inventive positive-working photosensitive resin composition is further admixed with each a limited amount of various kinds of known additives including auxiliary resins to improve the film properties of the resist layer, plasticizers, stabilizers and coloring agents to improve the visibility of the patterned resist layer after development.

Following is a brief description of a typical procedure of the photolithographic patterning work by using the inventive positive-working photosensitive resin composition. Thus, a substrate such as a semiconductor silicon wafer is uniformly coated with the photoresist composition in the form of a coating solution prepared by dissolving the essential and optional ingredients in an organic solvent by using a suitable coating machine such as a spinner followed by drying to form a photosensitive resist layer which is exposed pattern-wise to actinic rays such as ultraviolet light emitted from a low-pressure mercury lamp, high-pressure mercury lamp, ultrahigh-pressure mercury lamp, arc lamp, xenon lamp and the like through a desired patterned photomask or by the irradiation with an electron beam scanned along a desired pattern to form a patterned latent image. The next step is a development treatment of the latent image by immersing the resist layer on the substrate in a developer solution which is a weakly alkaline aqueous solution of an organic basic compound such as tetramethyl ammonium hydroxide in a concentration of 1 to 10% by weight so that the resist layer in the exposed areas is dissolved away in the developer solution to leave the resist layer in the unexposed areas forming a patterned resist layer having high fidelity to the pattern on the photomask.

In the following, the positive-working photosensitive resin composition of the invention is illustrated in more detail by way of examples, in which the term of "parts" always refers to "parts by weight". In the examples, the photosensitive resin compositions prepared there were evaluated for the items given below by the respective testing procedures described there.

(1) Photosensitivity:

A semiconductor silicon wafer was coated on one surface with a coating solution of the resin composition by using a spinner followed by drying for 90 seconds on a hot plate kept at 110° C. to give a dried resist layer having a uniform thickness of 1.3 $\mu$m. The resist layer was exposed patternwise to ultraviolet light on a minifying light-exposure machine (Model NSR-1505G4D, manufactured by Nikon Co.) for an exposure time varied stepwise from 0.1 second with each an increment of 0.0 second followed by a development treatment for 1 minute in a 2.38% by weight aqueous solution of tetramethyl ammonium hydroxide at 23° C., rinsing in running water for 30 seconds and drying to give a patterned resist layer. Recording was made for the minimum exposure time in milliseconds by which a patterned resist layer of high fidelity could be obtained as a measure of the photosensitivity of the composition.

(2) Film thickness retention:

Measurements were performed in the resist layer patterned in the above described manner for the thickness of the resist layer in the unexposed areas before and after the development treatment. Recording was made of the ratio of the thickness after the development treatment to the thickness before the development.

(3) Cross sectional profile of line pattern:

Microscopic observation was undertaken for the cross section of a line pattern having a width of 0.5 $\mu$m as formed in the above described manner. The cross sectional profile was recorded as "good" or "poor" when the cross section was orthogonally upright on the substrate surface and when the side lines of the cross sectional profile were inclined increasing the line width toward the bottom, respectively.

(4) Heat resistance:

The silicon wafer bearing the patterned resist layer was heated for 5 minutes on a hot plate kept at 110° C., 120° C., 130° C., 140° C. or 150° C. and occurrence of deformation of the pattern was microscopically examined. Record was made for the highest temperature at which absolutely no deformation in the patterned resist layer was detected after 5 minutes of heating.

(5) Storage stability:

The coating solution of the photosensitive resin composition was kept standing at room temperature in a hermetically sealed container for three months and visually inspected for the appearance of precipitates in the solution. The results were recorded as "good" or "poor" when precipitates were detected in the solution or not, respectively.

(6) Focusing latitude (tolerance in depth of focus):

Taking the Eop, which is the minimum exposure dose to obtain a line-and-space patterned resist layer on a substrate surface with a 1:1 ratio of the line width to the space width of each 0.5 μm as the base exposure dose, exposure tests of the photosensitive layer were conducted at the Eop on a minifying light-exposure machine (Model NSR-1755i7B, manufactured by Nikon Co.) making focus points varied up and down within the thickness of the photosensitive layer followed by a development treatment to give line-and-space patterned resist layers of which the orthogonality of the line pattern was examined with a scanning electron microscope. The focusing latitude here was defined to be the maximum shift of the focus point in μm by which a line pattern of 0.5 μm having an orthogonal cross sectional profile could be obtained. Recording of the results was made in three ratings of A, B and C when the focusing latitude was 1.2 μm or larger, from 0.8 to 1.1 μm and 0.7 μm or smaller, respectively.

EXAMPLE 1

A cresol novolac resin having a weight-average molecular weight of 11,000 and freed from low molecular-weight fractions by fractionation was obtained from a crude cresol novolac resin prepared by the condensation reaction of a 40:60 mixture of m- and p-cresols with formaldehyde in the presence of an oxalic acid catalyst according to a conventional procedure.

In the next place, 100 parts of this cresol novolac resin and 30 parts of a reaction product of 1 mole of bis(5-cyclohexyl-4-hydroxy-2-methylphenyl)-2-hydroxyphenyl methane and 3 moles of naphthoquinone-1,2-diazide-5-sulfonyl chloride as the photosensitizing agent were dissolved in 350 parts of ethyl lactate and the solution was filtered through a membrane filter of 0.2 μm pore diameter to prepare a coating solution of a positive-working photosensitive resin composition.

The thus prepared coating solution of the photosensitive resin composition was subjected to the evaluation tests as described above to give the results shown in Table 1 to follow.

EXAMPLE 2

The experimental procedure was substantially the same as in Example 1 except that the cresol novolac resin had a weight-average molecular weight of 12,000 and the photosensitizing agent was an esterification product of 1 mole of bis(5-cyclohexyl-4-hydroxy-2-methylphenyl)-2-hydroxyphenyl methane and 3 moles of naphthoquinone-1,2-diazide-4-sulfonyl chloride instead of naphthoquinone-1,2-diazide-5-sulfonyl chloride.

The results of the evaluation tests of this photosensitive resin composition are shown also in Table 1.

EXAMPLE 3

The experimental procedure was substantially the same as in Example 1 except that the cresol novolac resin had a weight-average molecular weight of 12,000 and the photosensitizing agent was an esterification product of 1 mole of bis(5-cyclohexyl-4-hydroxy-2-methylphenyl)-2-hydroxy-4-methylphenyl methane instead of bis(5-cyclohexyl-4-hydroxy-2-methylphenyl)-2-hydroxyphenyl methane and 3 moles of naphthoquinone-1,2-diazide-5-sulfonyl chloride.

The results of the evaluation tests of this photosensitive resin composition are shown also in Table 1.

COMPARATIVE EXAMPLE 1

The experimental procedure was substantially the same as in Example 1 except that the photosensitizing agent was an esterification product of 1 mole of 2,3,4,4'-tetrahydroxybenzophenone and 4 moles of naphthoquinone-1,2-diazide-5-sulfonyl chloride.

The results of the evaluation tests of this photosensitive resin composition are shown also in Table 1

COMPARATIVE EXAMPLE 2

The experimental procedure was substantially the same as in Example 1 except that the photosensitizing agent was an esterification product of 1 mole of bis(2-hydroxyphenyl)-4-hydroxyphenyl methane and 3 moles of naphthoquinone-1,2-diazide-5-sulfonyl chloride.

The results of the evaluation tests of this photosensitive resin composition are shown also in Table 1.

COMPARATIVE EXAMPLE 3

The experimental procedure was substantially the same as in Example 1 except that the photosensitizing agent was an esterification product of 1 mole of bis(4-hydroxy-2,5-dimethylphenyl)-3-hydroxyphenyl methane and 3 moles of naphthoquinone-1,2-diazide-4-sulfonyl chloride.

The results of the evaluation tests of this photosensitive resin composition are shown also in Table 1

EXAMPLE 4

The experimental procedure was substantially the same as in Example 1 except that the photosensitizing agent was an esterification product of 1 mole of bis(5-cyclohexyl-4-hydroxy-2-methylphenyl)-4-hydroxyphenyl methane instead of bis(5-cyclohexyl-4-hydroxy-2-methylphenyl)-2-hydroxyphenyl methane and 3.0 moles of naphthoquinone-1,2-diazide-5-sulfonyl chloride.

The results of the evaluation tests of this photosensitive resin composition are shown also in Table 1.

EXAMPLE 5

The experimental procedure was substantially the same as in Example 1 except that the photosensitizing agent was an esterification product of 1 mole of bis(5-cyclohexyl-4-hydroxy-2-methylphenyl)-3,4-dihydroxyphenyl methane instead of bis(5-cyclohexyl-4-hydroxy-2-methylphenyl)-2-hydroxyphenyl methane and 3.5 moles of naphthoquinone-1,2-diazide-5-sulfonyl chloride.

The results of the evaluation tests of this photosensitive resin composition are shown also in Table 1

EXAMPLE 6

The experimental procedure was substantially the same as in Example 1 except that the photosensitizing agent was an esterification product of 1 mole of bis(5-cyclohexyl-2-hydroxy-4-methylphenyl)-2-hydroxyphenyl methane instead of bis(5-cyclohexyl-4-hydroxy-2-methylphenyl)-2-hydroxyphenyl methane and 3.0 moles of naphthoquinone-1,2-diazide-5-sulfonyl chloride.

The results of the evaluation tests of this photosensitive resin composition are shown also in Table 1.

EXAMPLE 7

The experimental procedure was substantially the same as in Example 1 except that the photosensitizing agent was an esterification product of 1 mole of bis(5-cyclohexyl-2-hydroxy-4-methylphenyl)-4-hydroxyphenyl methane instead of bis(5-cyclohexyl-4-hydroxy-2-methylphenyl)-2-hydroxyphenyl methane and 3.0 moles of naphthoquinone-1,2-diazide-5-sulfonyl chloride.

The results of the evaluation tests of this photosensitive resin composition are shown also in Table 1.

EXAMPLE 8

The experimental procedure was substantially the same as in Example 1 except that the photosensitizing agent was an esterification product of 1 mole of bis(5-cyclohexyl-2-hydroxy-4-methylphenyl)-3,4-dihydroxyphenyl methane instead of bis(5-cyclohexyl-4-hydroxy-2-methylphenyl)-2-hydroxyphenyl methane and 3.5 moles of naphthoquinone-1,2-diazide-5-sulfonyl chloride.

The results of the evaluation tests of this photosensitive resin composition are shown also in Table 1.

TABLE 1

| | Photo-sensitivity, ms | Film thickness retention, % | Cross sectional profile | Heat resistance, °C. | Storage stability | Focusing latitude |
|---|---|---|---|---|---|---|
| Example 1 | 250 | 98 | Good | 150 | Good | A |
| Example 2 | 220 | 97 | Good | 150 | Good | B |
| Example 3 | 260 | 98 | Good | 150 | Good | A |
| Compartive Example 1 | 200 | 95 | Poor | 140 | Poor | C |
| Comparative Example 2 | 500 | 98 | Good | 130 | Good | C |
| Comparative Example 3 | 350 | 98 | Good | 130 | Good | C |
| Example 4 | 250 | 98 | Good | 150 | Good | B |
| Example 5 | 200 | 99 | Good | 150 | Good | A |
| Example 6 | 230 | 98 | Good | 150 | Good | A |
| Example 7 | 240 | 97 | Good | 150 | Good | B |
| Example 8 | 200 | 98 | Good | 150 | Good | A |

What is claimed is:

1. A positive-working photosensitive resin composition which comprises, as a uniform mixture:
   (a) an alkali-soluble novolac resin as a film-forming agent; and
   (b) a triphenyl methane compound represented by the general formula

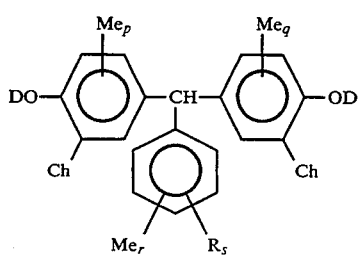

or the general formula

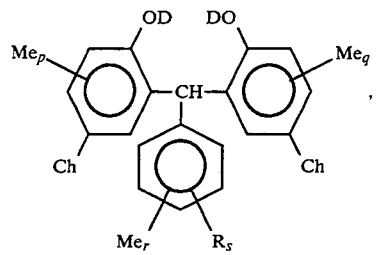

in which at least one of the groups denoted by D is a naphthoquinone 1,2-diazide sulfonyl group, the remainder, if any, being each a hydrogen atom, the groups denoted by R are, each independently from the others, a hydrogen atom, a hydroxy group or a group denoted by OD, Me denotes a methyl group, Ch denotes a cyclohexyl group, the subscripts p, q and r are, each independently from the others, 0, 1, 2 or 3 and the subscript s is a positive integer with the proviso that $r+s=5$, as a photosensitizing agent.

2. The positive-working photosensitive resin composition as claimed in claim 1 in which the photosensitizing agent as the component (b) is a compound represented by the general formula

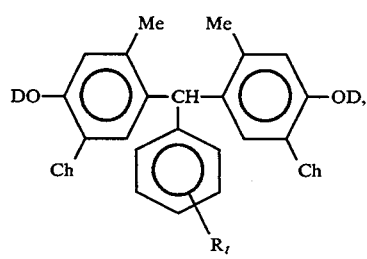

in which each symbol has the same meaning as defined above.

3. The positive-working photosensitive resin composition as claimed in claim 1 in which the photosensitizing agent as the component (b) is a compound represented by the general formula

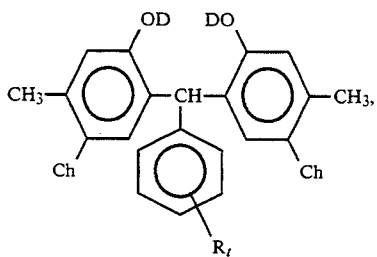

in which each symbol has the same meaning as defined above.

4. The positive-working photosensitive resin composition as claimed in claim 1 in which the photosensitizing agent as the component (b) is a compound represented by the general formula

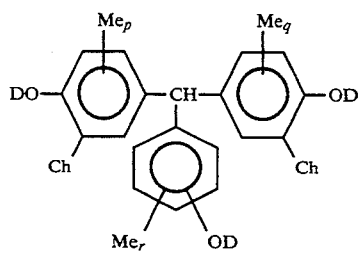

in which each symbol has the same meaning as defined above.

5. The positive-working photosensitive resin composition as claimed in claim 1 in which the photosensitizing agent as the component (b) is a compound represented by the general formula

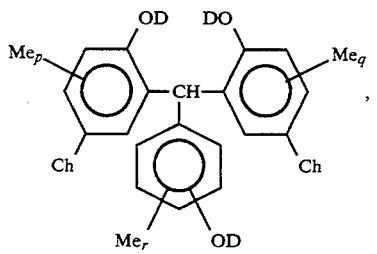

in which each symbol has the same meaning as defined above.

6. The positive-working photosensitive resin composition as claimed in claim 1 in which the photosensitizing agent as the component (b) is a compound represented by the general formula

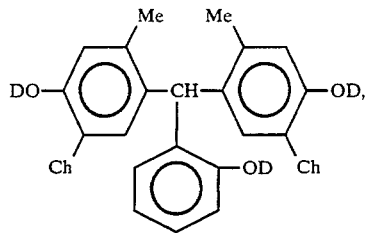

in which each symbol has the same meaning as defined above.

7. The positive-working photosensitive resin composition as claimed in claim 1 in which the photosensitizing agent as the component (b) is a compound represented by the general formula

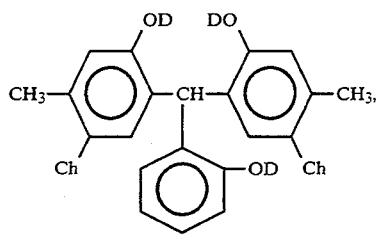

in which each symbol has the same meaning as defined above.

8. The positive-working photosensitive resin composition as claimed in claim 1 in which the alkali-soluble novolac resin as the component (a) has a weight-average molecular weight in the range from 2000 to 20000.

9. The positive-working photosensitive resin composition as claimed in claim 1 in which the weight ratio of the alkali-soluble novolac resin as the component (a) to the photosensitizing agent as the component (b) is in the range from 1:2 to 20:1.

10. The positive-working photosensitive resin composition as claimed in claim 9 in which the weight ratio of the alkali-soluble novolac resin as the component (a) to the photosensitizing agent as the component (b) is in the range from 1:1 to 6:1.

11. The positive-working photosensitive resin composition as claimed in claim 1 in which the groups denoted by D are each a naphthoquinone 1,2-diazide sulfonyl group.

12. The positive-working photosensitive resin composition as claimed in claim 1 in which the photosensitizing agent as the component (b) is an esterification product of bis(5-cyclohexyl-4-hydroxy-2-methylphenyl)-2-hydroxyphenyl methane and naphthoquinone-1,2-diazide-4- or -5-sulfonyl chloride.

13. The positive-working photosensitive resin composition as claimed in claim 1 in which the photosensitizing agent as the component (b) is an esterification product of bis(5-cyclohexyl-4-hydroxy-2-methylphenyl)-2-hydroxy-4-methylphenyl methane and naphthoquinone-1,2-diazide-4- or -5-sulfonyl chloride.

14. The positive-working photosensitive resin composition as claimed in claim 1 in which the alkali-soluble novolac resin as the component (a) is a condensation product of m-cresol and p-cresol in combination with formaldehyde.

* * * * *